United States Patent
Grigg et al.

(10) Patent No.: US 6,585,927 B2
(45) Date of Patent: Jul. 1, 2003

(54) METHODS FOR LABELING SEMICONDUCTOR DEVICE COMPONENTS

(75) Inventors: Ford B. Grigg, Meridian, ID (US); James M. Ocker, Kuna, ID (US); Rick A. Leininger, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 109 days.

(21) Appl. No.: 09/736,624

(22) Filed: Dec. 14, 2000

(65) Prior Publication Data

US 2001/0035597 A1 Nov. 1, 2001

Related U.S. Application Data

(62) Division of application No. 09/481,779, filed on Jan. 11, 2000, now Pat. No. 6,337,122.

(51) Int. Cl.[7] .......................... B29C 35/08; B29C 41/02; B29C 70/88; B29C 71/02
(52) U.S. Cl. ....................... 264/401; 264/132; 264/236; 264/272.17; 264/340
(58) Field of Search ................................ 264/132, 236, 264/272.17, 340, 401

(56) References Cited

U.S. PATENT DOCUMENTS

| | | |
|---|---|---|
| 814,592 A | 3/1906 | Duane |
| 3,835,564 A | 9/1974 | Gottschalk |
| 4,246,307 A | 1/1981 | Trautwein |
| 4,375,025 A | 2/1983 | Carlson |
| 4,585,931 A | 4/1986 | Duncan et al. |
| 4,638,144 A | 1/1987 | Latta, Jr. |
| 4,707,722 A | 11/1987 | Folk et al. |
| 4,719,502 A | 1/1988 | Ikeya et al. |
| 4,753,863 A | 6/1988 | Spanjer |
| 4,861,620 A | 8/1989 | Azuma et al. |
| 4,936,606 A | 6/1990 | Moss |
| 4,945,204 A | 7/1990 | Nakamura et al. |
| 5,173,220 A | 12/1992 | Reiff et al. |
| 5,264,061 A | 11/1993 | Juskey et al. |
| 5,278,442 A | 1/1994 | Prinz et al. |
| 5,329,090 A | 7/1994 | Woelki et al. |
| 5,357,077 A | 10/1994 | Tsuruta |
| 5,484,314 A | 1/1996 | Farnworth |
| 5,562,993 A | 10/1996 | Hotta |
| 5,691,023 A | 11/1997 | Keller |
| 5,705,117 A | 1/1998 | O'Connor et al. |
| 5,770,288 A | 6/1998 | Carney, Jr. |
| 5,981,013 A | 11/1999 | Russ et al. |
| 5,985,510 A | 11/1999 | Akutsu et al. |
| 6,153,034 A | 11/2000 | Lipsker |
| 6,242,076 B1 | 6/2001 | Andriash |
| 6,270,712 B1 * | 8/2001 | Shoji et al. ............ 264/272.17 |
| 6,278,193 B1 | 8/2001 | Coico et al. |
| 6,420,790 B1 | 7/2002 | Koizumi |

FOREIGN PATENT DOCUMENTS

| | | | |
|---|---|---|---|
| JP | 01244631 A | * 9/1989 | .................. 264/340 |
| WO | WO-9821626 A1 | * 5/1998 | |

* cited by examiner

Primary Examiner—Leo B. Tentoni
(74) Attorney, Agent, or Firm—TraskBritt

(57) ABSTRACT

A stereolithographically fabricated marking for a semiconductor device component, such as a packaged or unpackaged semiconductor device or another substrate. When formed on a semiconductor device with a stereolithographically formed package structure, the marking may be integral with the package. The marking may be formed as apertures through or recesses in one or more stereolithographically fabricated layers of material, or the marking may include one or more stereolithographically fabricated layers that protrude from a surface of a semiconductor device component. Raised markings may also be formed on the surfaces of packaged or bare semiconductor device components. Alternatively, the marking may be fabricated separately from a semiconductor device component, then secured thereto. Methods for stereolithographically marking semiconductor device components are also disclosed. A machine vision system may be used in such methods so as to recognize the position and orientation of a semiconductor device or other substrate to be stereolithographically marked.

31 Claims, 6 Drawing Sheets

METHODS FOR LABELING SEMICONDUCTOR DEVICE COMPONENTS

CROSS-REFERENCE TO RELATED APPLICATION

This application is a divisional of application Ser. No. 09/481,779, filed Jan. 11, 2000, now U.S. Pat. No. 6,337,122 issued Jan. 8, 2002.

BACKGROUND OF THE INVENTION

1. Field of the Invention

The present invention relates generally to methods of marking semiconductor devices and to semiconductor devices so marked. Particularly, the present invention pertains to the use of stereolithographic techniques to mark semiconductor devices and to stereolithographically marked semiconductor devices.

2. State of the Art

Semiconductor Device Marking

Since the first semiconductor devices became commercially available, manufacturers have found it necessary to mark each chip or chip assembly (bare die or packaged die) with the company name, a part or serial number, or other information such as lot number or die location. Conventional marking methods utilize a mechanical device to transfer ink contained in an ink pad to the surface of a roller or stamp. An individual chip is then stamped, and the automated process is repeated for subsequent chips.

Because of its mechanical nature and the drying time associated with ink, an ink stamping process is relatively slow. Moreover, if the mark is accidentally touched prior to complete drying, the mark will smudge. In chip manufacturing processes using such an ink stamping method, the ink marking operation may have to be included at a relatively early stage of production (if the die itself is to be marked) or just after post-encapsulation processing (if the package is to be marked) to allow for drying time without affecting the production rate. Such early marking may result, however, in marking defective chips that never make it completely through the manufacturing and testing process.

Moreover, when the marked chips are packaged, ink stamping presents an additional step in the fabrication and packaging of the chips.

Another problem associated with ink stamping methods is that the quality of ink stamped marks may substantially vary over time. This variation may be dependent upon the quantity of ink applied, ambient temperature and humidity, and/or the condition of the surface of the stamp. In any event, the consistency of a stamped mark may vary widely from chip to chip.

As a result of the deficiencies associated with ink stamping, it has become increasingly popular to use a laser beam to mark the surface of a chip. Unlike ink stamping, laser marking is very fast, requires no curing time, has a consistently high quality, and can take place at the end of the manufacturing process so that only good chips are marked.

Various machines and methods have been developed for marking a chip package with a laser. As illustrated in U.S. Pat. Nos. 5,357,077 to Tsuruta, 5,329,090 to Woelki et al., 4,945,204 to Nakamura et al., 4,638,144 to Latta, Jr., 4,585,931 to Duncan et al., and 4,375,025 to Carlson, a semiconductor device is placed in a position where a laser beam, usually produced by a carbon dioxide, Nd:YAG, or Nd:YLF laser, inscribes various characters or other information on a surface of the semiconductor device. Basically, the laser beam burns the surface of the chip package such that a different reflectivity from the rest of the chip package surface is formed. By holding the packaged chip at a proper angle to a light source, the information inscribed on the chip package surface by the laser can be read. Various materials are known in the art that are laser reactive (e.g., capable of changing color when contacted by a laser beam). As described in U.S. Pat. Nos. 4,861,620 to Azuma et al., 4,753,863 to Spanjer, and 4,707,722 to Folk et al., the part or component may be partially comprised of the laser markable material or have a coating of the material on the surface of the part or component to be marked.

Using a laser to mark a chip is a fast and economical means of marking. There are, however, certain disadvantages associated with state-of-the-art laser marking techniques that merely burn the surface to achieve the desired mark in comparison to ink stamping. For example, ink stamping provides a clearly visible image on the surface of a chip at nearly every angle of incidence to a light source. A mark burned in a surface by a laser, on the other hand, may only be visible at select angles of incidence to a light source. Further, oils or other contaminants deposited on the chip surface subsequent to marking may blur or even obscure the laser mark. Additionally, because the laser actually burns the surface of the work piece, for bare die marking, the associated burning may damage the internal circuitry of the chip directly or by increasing internal die temperature beyond acceptable limits. Moreover, where the manufactured part is not produced of a laser reactive material, laser reactive coatings applied to the surface of a component add expense and may take hours to cure. In addition, when the chip is packaged, as with ink stamping, laser marking requires an additional post-packaging step.

Thus, it would be advantageous to provide a marking technique that combines the speed and precision of laser marking with the contrast and distinctiveness of ink stamping, without any substantial curing or drying time. Moreover, it would be advantageous to develop a method and apparatus for marking the surface of a semiconductor chip that does not harm the circuitry enclosed therein. It would also be advantageous to provide a method for marking semiconductor chips as the chips are being packaged.

Stereolithography

In the past decade, a manufacturing technique termed "stereolithography", also known as "layered manufacturing", has evolved to a degree where it is employed in many industries.

Essentially, stereolithography as conventionally practiced involves utilizing a computer to generate a three-dimensional (3-D) mathematical simulation or model of an object to be fabricated, such generation usually effected with 3-D computer-aided design (CAD) software. The model or simulation is mathematically separated or "sliced" into a large number of relatively thin, parallel, usually vertically superimposed layers, each layer having defined boundaries and other features associated with the model (and thus the actual object to be fabricated) at the level of that layer within the exterior boundaries of the object. A complete assembly or stack of all of the layers defines the entire object, and surface resolution of the object is, in part, dependent upon the thickness of the layers.

The mathematical simulation or model is then employed to generate an actual object by building the object, layer by superimposed layer. A wide variety of approaches to stereolithography by different companies has resulted in techniques for fabrication of objects from both metallic and non-metallic materials. Regardless of the material employed to fabricate an object, stereolithographic techniques usually involve disposition of a layer of unconsolidated or unfixed material corresponding to each layer within the object boundaries, followed by selective consolidation or fixation of the material to at least a partially consolidated, or semi-solid, state in those areas of a given layer corresponding to portions of the object, the consolidated or fixed material also at that time being substantially concurrently bonded to a lower layer of the object to be fabricated. The unconsolidated material employed to build an object may be supplied in particulate or liquid form, and the material itself may be consolidated or fixed, or a separate binder material may be employed to bond material particles to one another and to those of a previously-formed layer. In some instances, thin sheets of material may be superimposed to build an object, each sheet being fixed to a next lower sheet and unwanted portions of each sheet removed, a stack of such sheets defining the completed object. When particulate materials are employed, resolution of object surfaces is highly dependent upon particle size, whereas when a liquid is employed, surface resolution is highly dependent upon the minimum surface area of the liquid which can be fixed and the minimum thickness of a layer that can be generated. Of course, in either case, resolution and accuracy of object reproduction from the CAD file is also dependent upon the ability of the apparatus used to fix the material to precisely track the mathematical instructions indicating solid areas and boundaries for each layer of material. Toward that end, and depending upon the layer being fixed, various fixation approaches have been employed, including particle bombardment (electron beams), disposing a binder or other fixative (such as by ink-jet printing techniques), or irradiation using heat or specific wavelength ranges.

An early application of stereolithography was to enable rapid fabrication of molds and prototypes of objects from CAD files. Thus, either male or female forms on which mold material might be disposed might be rapidly generated. Prototypes of objects might be built to verify the accuracy of the CAD file defining the object and to detect any design deficiencies and possible fabrication problems before a design was committed to large-scale production.

In more recent years, stereolithography has been employed to develop and refine object designs in relatively inexpensive materials, and has also been used to fabricate small quantities of objects where the cost of conventional fabrication techniques is prohibitive for same, such as in the case of plastic objects conventionally formed by injection molding. It is also known to employ stereolithography in the custom fabrication of products generally built in small quantities or where a product design is rendered only once. Finally, it has been appreciated in some industries that stereolithography provides a capability to fabricate products, such as those including closed interior chambers or convoluted passageways, which cannot be fabricated satisfactorily using conventional manufacturing techniques. It has also been recognized in some industries that a stereolithographic object or component may be formed or built around another, pre-existing object or component to create a larger product.

However, to the inventors' knowledge, stereolithography has yet to be applied to mass production of articles in volumes of thousands or millions, or employed to produce, augment or enhance products including other, pre-existing components in large quantities, where minute component sizes are involved, and where extremely high resolution and a high degree of reproducibility of results is required. In particular, the inventor is not aware of the use of stereolithography to mark bare or packaged semiconductor devices. Furthermore, conventional stereolithography apparatus and methods fail to address the difficulties of precisely locating and orienting a number of pre-existing components for stereolithographic application of material thereto without the use of mechanical alignment techniques or to otherwise assuring precise, repeatable placement of components.

SUMMARY OF THE INVENTION

According to one aspect, the present invention includes a method for marking semiconductor devices. In a preferred embodiment of the method, a computer-controlled, 3-D CAD initiated process known as "stereolithography" or "layered manufacturing" is used to mark semiconductor devices. When stereolithographic processes are employed, each mark is formed as either a single layer or a series of superimposed, contiguous, mutually adhered layers of material.

The stereolithographic semiconductor device marking method of the present invention preferably includes the use of a machine vision system to locate the semiconductor devices or substrates that are to be marked, as well as the features or other components on or associated with the semiconductor devices or substrates (e.g., contact pads, conductive traces, etc.). The use of a machine vision system directs the alignment of a stereolithography system with each semiconductor device or substrate for material disposition purposes. Accordingly, the semiconductor devices or substrates need not be precisely mechanically aligned with any component of the stereolithography system to practice the stereolithographic embodiment of the method of the present invention.

In a preferred embodiment, the markings to be fabricated upon a semiconductor device component in accordance with the invention are fabricated using precisely focused electromagnetic radiation in the form of an ultraviolet (UV) wavelength laser under control of a computer and responsive to input from a machine vision system, such as a pattern recognition system, to fix or cure selected regions of a layer of a liquid photopolymer material disposed on the semiconductor device or substrate.

The present invention also includes stereolithographically formed semiconductor device markings, as well as semiconductor devices having stereolithographically formed markings thereon. The marking can be fabricated from a material that visibly contrasts with a surface at which the marking appears. The semiconductor devices can be packaged or comprise bare semiconductor dice.

In one embodiment, the semiconductor device includes a stereolithographically fabricated package. The mark, which is formed as the package is being fabricated, is recessed in a surface of the package. In a variation of the recessed mark embodiment of the present invention, a material that contrasts visually with the material of the stereolithographically fabricated package may be disposed in the recesses to enhance the visibility of the markings.

In another embodiment of the invention, which includes an at least partially packaged semiconductor device, the mark protrudes from, or is raised relative to, a surface of the packaging material in a manner similar to engraving. Such a mark can be fabricated following the packaging process and separately therefrom. Accordingly, the mark can be fabricated on the surface of a stereolithographically formed package or on a package that was previously formed by any other known technique. Alternatively, the mark can be formed integrally with a stereolithographically fabricated package.

In yet another embodiment, the marked semiconductor device is a bare semiconductor die or other bare substrate. The stereolithographically formed mark is fabricated directly on a surface of the bare substrate and protrudes therefrom, or is raised relative thereto.

Other features and advantages of the present invention will become apparent to those of skill in the art through consideration of the ensuing description, the accompanying drawings, and the appended claims.

DETAILED DESCRIPTION OF THE INVENTION

Marked Semiconductor Devices

Figure 1:
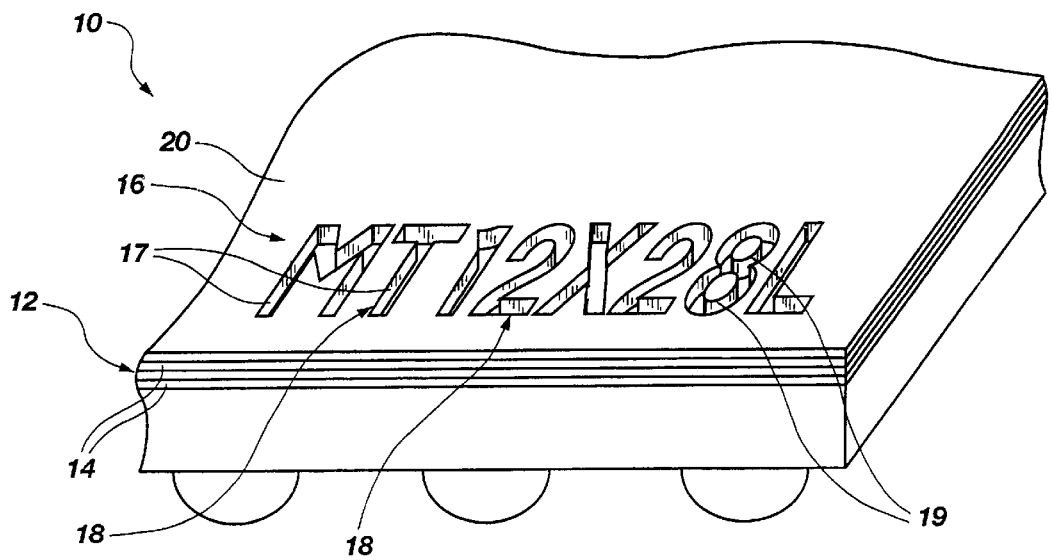
FIG. 1 is a partial, enlarged perspective view of a marked, packaged semiconductor device with a marking recessed in the surface of the packaging thereof.

With reference to FIG. 1, a packaged semiconductor device 10 is shown. Semiconductor device 10 is a packaged semiconductor device of the type disclosed in U.S. patent application Ser. No. 09/259,142, filed on Feb. 26, 1999 (hereinafter "the '142 application"), and assigned to the same assignee as that of the present invention, the disclosure of which is hereby incorporated herein by this reference. Thus, the package 12 of semiconductor device 10 includes a plurality of superimposed, contiguous, mutually adhered layers 14 of material. The uppermost layer or layers 14 of package 12 have one or more apertures 18 formed therethrough, the internal, lateral edges 17 of which define an outer periphery of a marking 16, or a mark, exposed at a surface 20 of package 12. Thus, marking 16 is recessed in the uppermost layers 14 of package 12. Of course, marking 16 may include some characters or symbols with inner peripheries (e.g., "O" and "8"). The inner peripheries of such characters or symbols are defined by the outer lateral edges 19 of isolated regions of layers 14.

Figure 2:
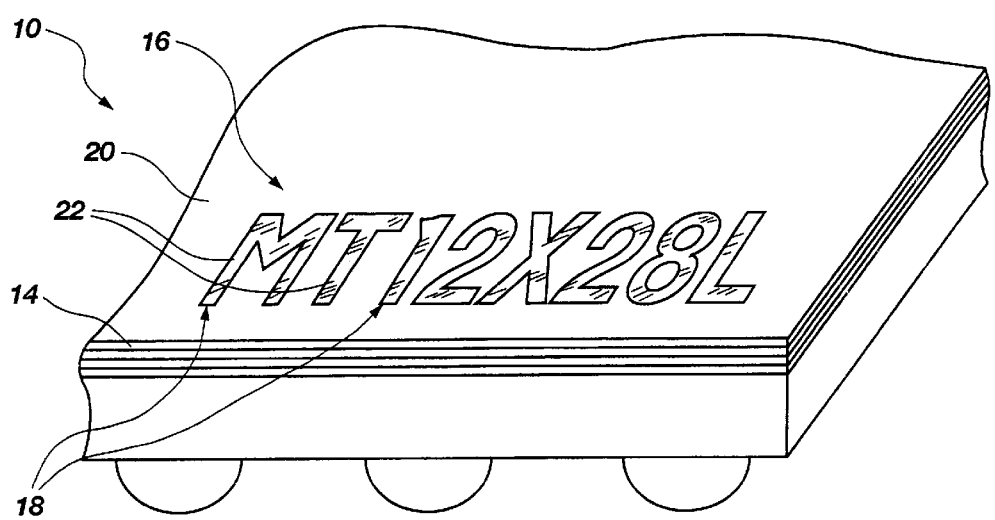
FIG. 2 is a partial, enlarged perspective view of a variation of the packaged semiconductor device of FIG. 1, with a visually contrasting material disposed in the recessed marking.

FIG. 2 illustrates a variation of semiconductor device 10, wherein marking 16 also includes a second material 22 disposed within and at least partially filling apertures 18. Second material 22 preferably contrasts visually with the material of at least the uppermost layer 14 of package 12.

Figure 3:
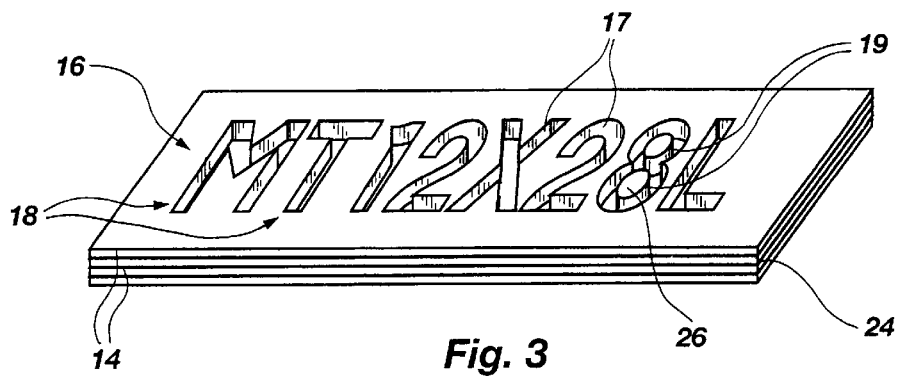
FIG. 3 is an enlarged perspective view of a marking, formed as recesses in a plurality of material layers, that may be fabricated on a semiconductor device or other substrate or that may be prefabricated, then secured to a semiconductor device or other substrate.

FIG. 3 shows a marking 16 defined as apertures through one or more layers 14. As noted previously herein, in addition to being defined by inner lateral edges 17 of layers 14, some characters of a recessed marking 16 may be partially defined by outer lateral edges 19 of isolated regions 26 of layers 14. These isolated regions 26 are structurally secured relative to the remainder of layers 14 by way of one or more base layers 24 underlying and secured to the lowermost layer 14. Marking 16 can be fabricated on a surface of a packaged or unpackaged semiconductor device or other substrate, or prefabricated and then secured to a surface of a packaged or unpackaged semiconductor device or other substrate by known processes, such as by the use of a suitable adhesive.

Figure 4:
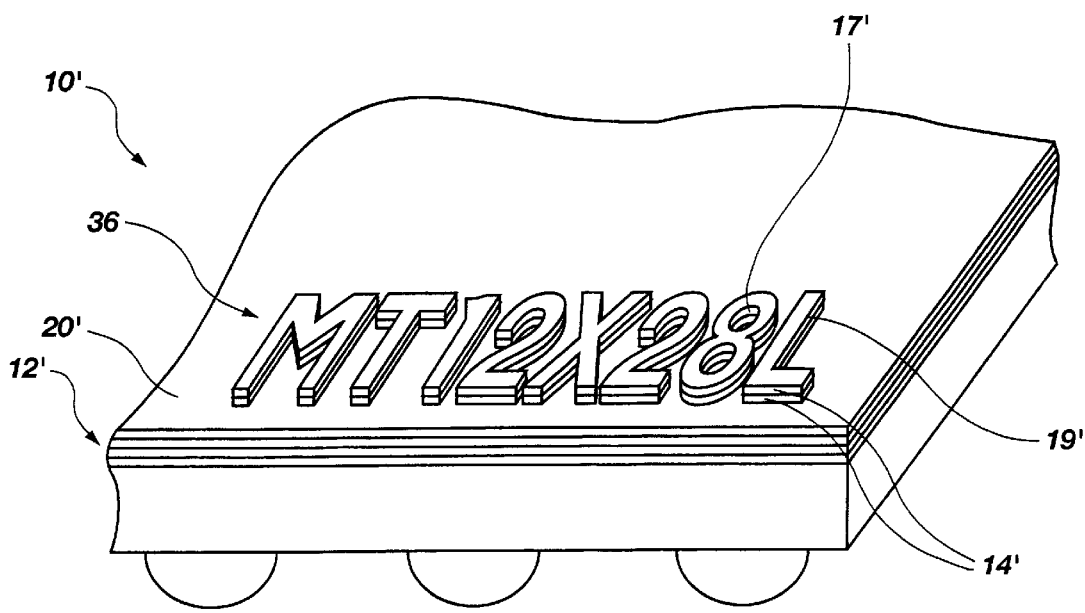
FIG. 4 is a partial, enlarged perspective view of another embodiment of a marked, packaged semiconductor device with a marking protruding from the surface thereof.

Turning now to FIG. 4, another embodiment of a packaged semiconductor device 10' is illustrated. Semiconductor device 10' has a package 12', which can be formed by any known technique, such as by transfer molding or by use of stereolithography, as disclosed in the '142 application. A marking 36 is disposed on a surface 20' of package 12'. Marking 36, which includes one or more layers 14' of material, is raised relative to, or protrudes from, surface 20'. Thus, marking 36 is defined at least partially by outer lateral edges 19' of layers 14'. Marking 36 may also have some characters or symbols with inner peripheries (e.g., "O" and "8"). Such characters or symbols are, of course, also partially defined by inner lateral edges 17' of layers 14'.

If package 12' has a plurality of superimposed, contiguous, mutually adhered, stereolithographically formed layers 14', marking 36 can be formed by the uppermost layer or layers 14' of package 12'.

Figure 5:
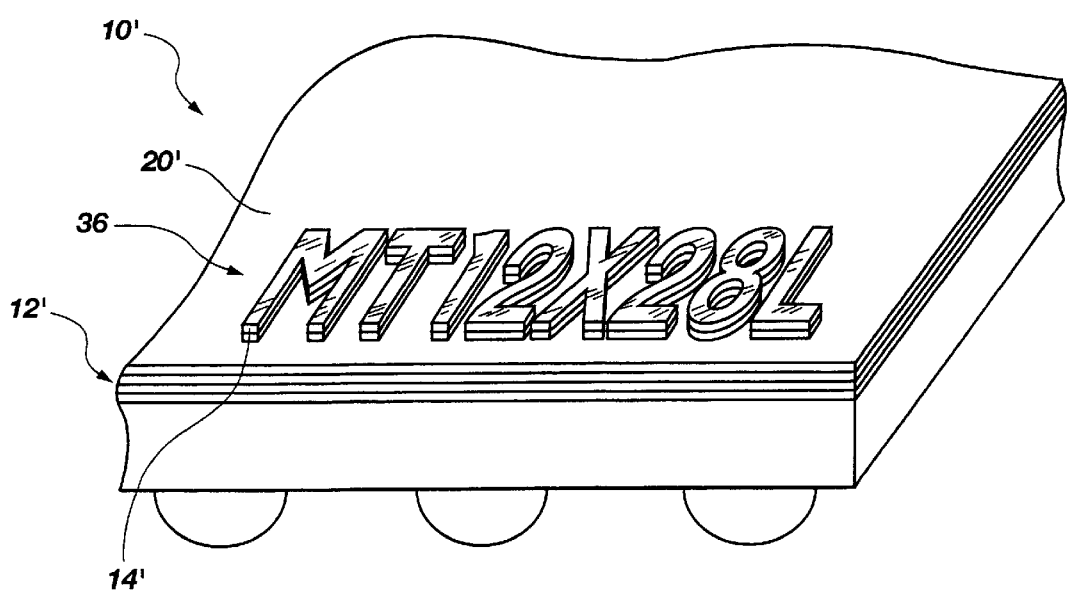
FIG. 5 is a partial, enlarged perspective view of a variation of the embodiment of the marked, packaged semiconductor device of FIG. 4, depicting a visually contrasting, raised marking disposed on a surface thereof.

FIG. 5 illustrates a variation of the semiconductor device 10' illustrated in FIG. 4, wherein marking 36 visually contrasts with areas of surface 20' of the underlying package 12' exposed around marking 36. Thus, at least the uppermost layer 14' of marking 36 is formed of a material that visually contrasts with the material at surface 20' of package 12'.

Figure 6:
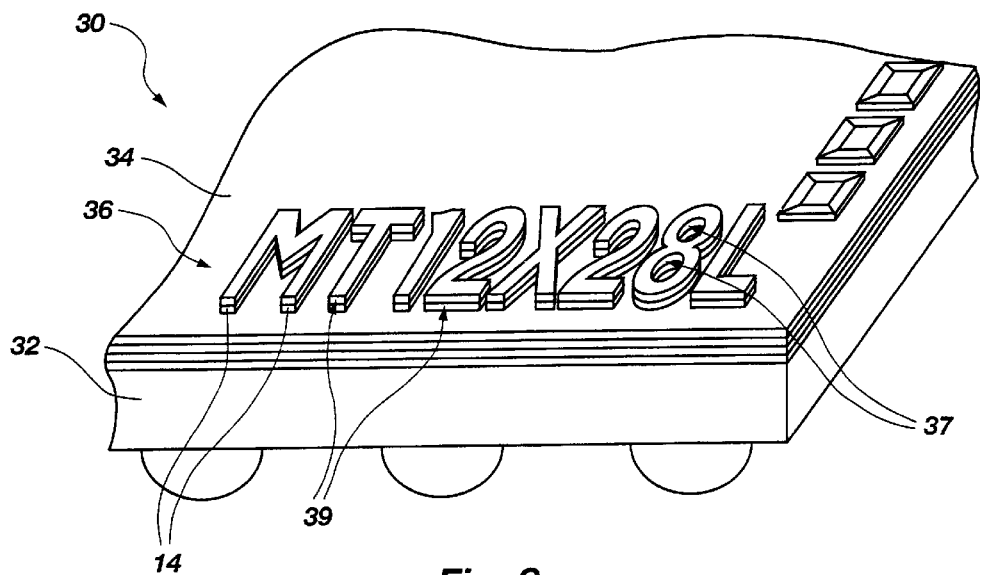
FIG. 6 is a partial, enlarged perspective view of another embodiment of a marked semiconductor device, wherein the marking is disposed on a bare substrate and raised relative to a surface thereof.

Referring to FIG. 6, another embodiment of a semiconductor device 30 according to the present invention includes a substrate 32 with an at least partially bare surface 34. A marking 36 is disposed on a bare portion of surface 34. Marking 36, which is raised relative to surface 34, or protrudes therefrom, includes one or more superimposed, contiguous, mutually adhered layers 14 of material, the lowermost layer of which is secured to surface 34. As marking 36 is raised relative to surface 34, marking 36 is defined by at least the outer edges 39 of layers 14. Of course, marking 36 may include some characters or symbols, such as "O" and "8", that also have regions that are defined by inner edges 37 of layers 14. As it is desired that marking 36 be plainly discernable on surface 34, it is preferred that at least the uppermost layer 14 of marking 36 contrast visually with the surrounding regions of surface 34.

Figure 7:
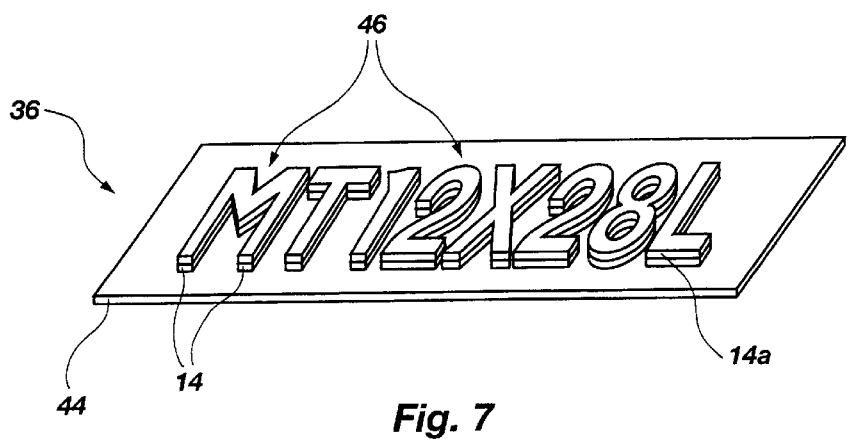
FIG. 7 is a perspective view of a marking, formed by a plurality of material layers, that may be fabricated on a semiconductor device or other substrate or that may be prefabricated, then secured to a semiconductor device or other substrate.

FIG. 7 shows a marking 36 with one or more base layers 44 that secure raised areas 46 thereof together. Each raised area 46 includes one or more layers 14 of material. The uppermost layer 14a of layers 14 may contrast visually with the regions of layer 44 that are exposed around raised areas 46. Marking 36 can be fabricated on a surface of a semiconductor device or other substrate or prefabricated, then secured to a surface of a semiconductor device or other substrate by known processes, such as by the use of a suitable adhesive.

Methods of Marking Semiconductor Devices

Methods of labeling, or marking, semiconductor devices with marking structures incorporating teachings of the present invention, such as those illustrated in and described with reference to FIGS. 1–7, are also within the scope of the present invention.

Figure 8:
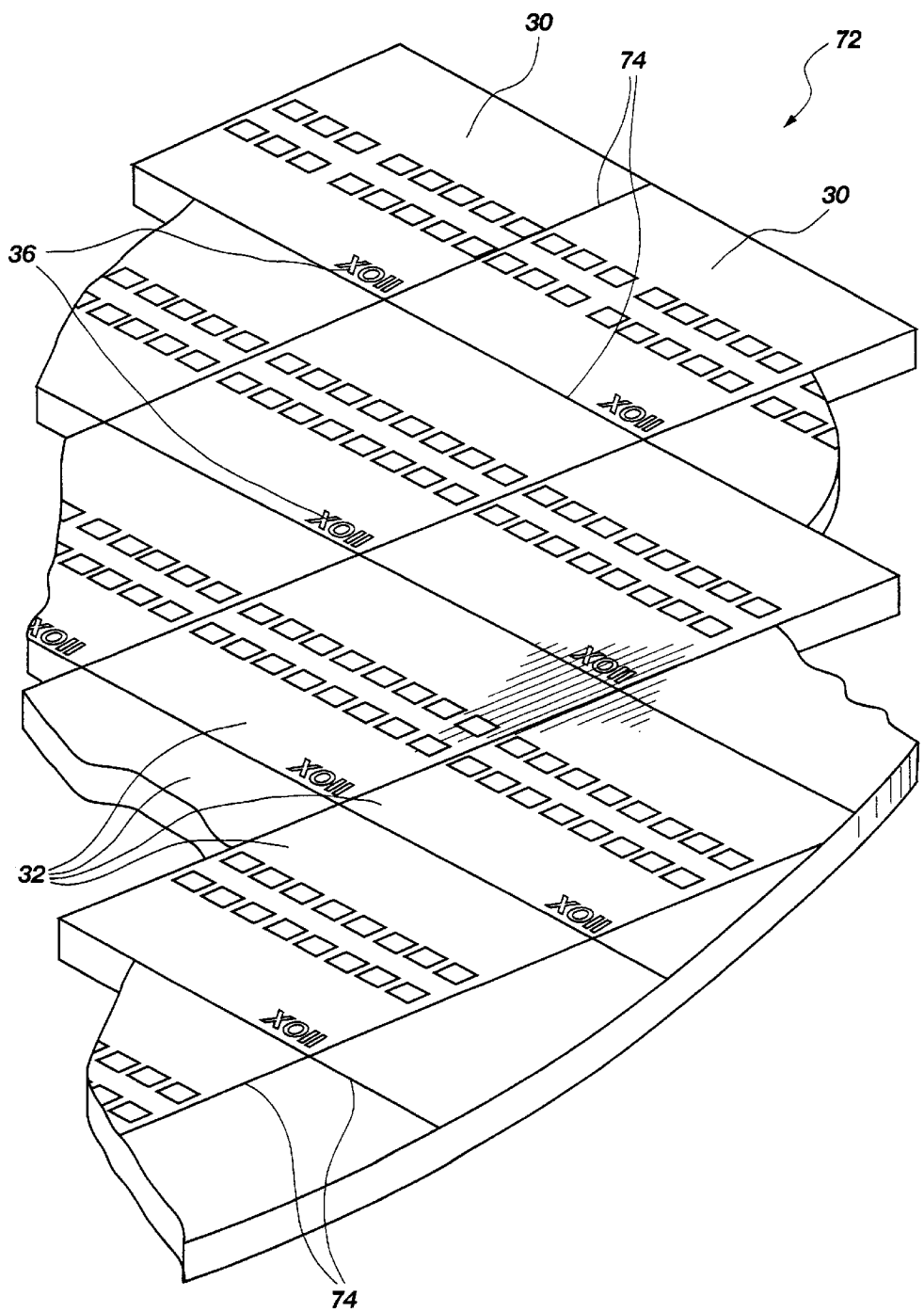
FIG. 8 is a perspective view of a portion of a wafer having a plurality of semiconductor devices thereon, depicting marking raised markings on the semiconductor devices.

Turning now to FIG. 8, semiconductor devices can be labeled with markings embodying teachings of the present invention while at the wafer level. FIG. 8 illustrates a wafer 72 with a plurality of semiconductor devices 30 thereon. Each semiconductor device 30, which has yet to be singulated, or diced, from wafer 72, is a bare substrate 32 (in this case, a semiconductor die) with markings 36 secured to a surface 34 thereof. Each semiconductor device 30 on wafer 72 is separated from adjacent semiconductor devices 30 by a street 74.

While the labeling processes is preferably performed substantially simultaneously on several semiconductor devices or other substrates, such as prior to singulating substrates 32 from wafer 72 or on a collection of individual semiconductor devices or other substrates, individual semiconductor devices or other substrates can also be marked in accordance with teachings of the present invention. As another alternative, the method of the present invention can be used to substantially simultaneously label a collection of different types of semiconductor devices or other substrates.

The markings of the present invention are preferably fabricated from a photo-curable polymer, or "photopolymer" by stereolithographic processes. For simplicity, the ensuing description is limited to an explanation of a method of labeling stereolithographically packaged semiconductor devices 10' with raised markings 36. In the illustrated embodiment of the present invention, markings 36 are fabricated in situ with the stereolithographic fabrication of packages 12' on a semiconductor device 10' or another substrate. As should be appreciated by those of skill in the art, however, the method described herein is also useful for fabricating markings separately from a substrate, as well as for labeling packaged or bare regions of semiconductor devices or other substrates with other embodiments of the markings according to the present invention.

Stereolithography Apparatus and Methods

Figure 9:
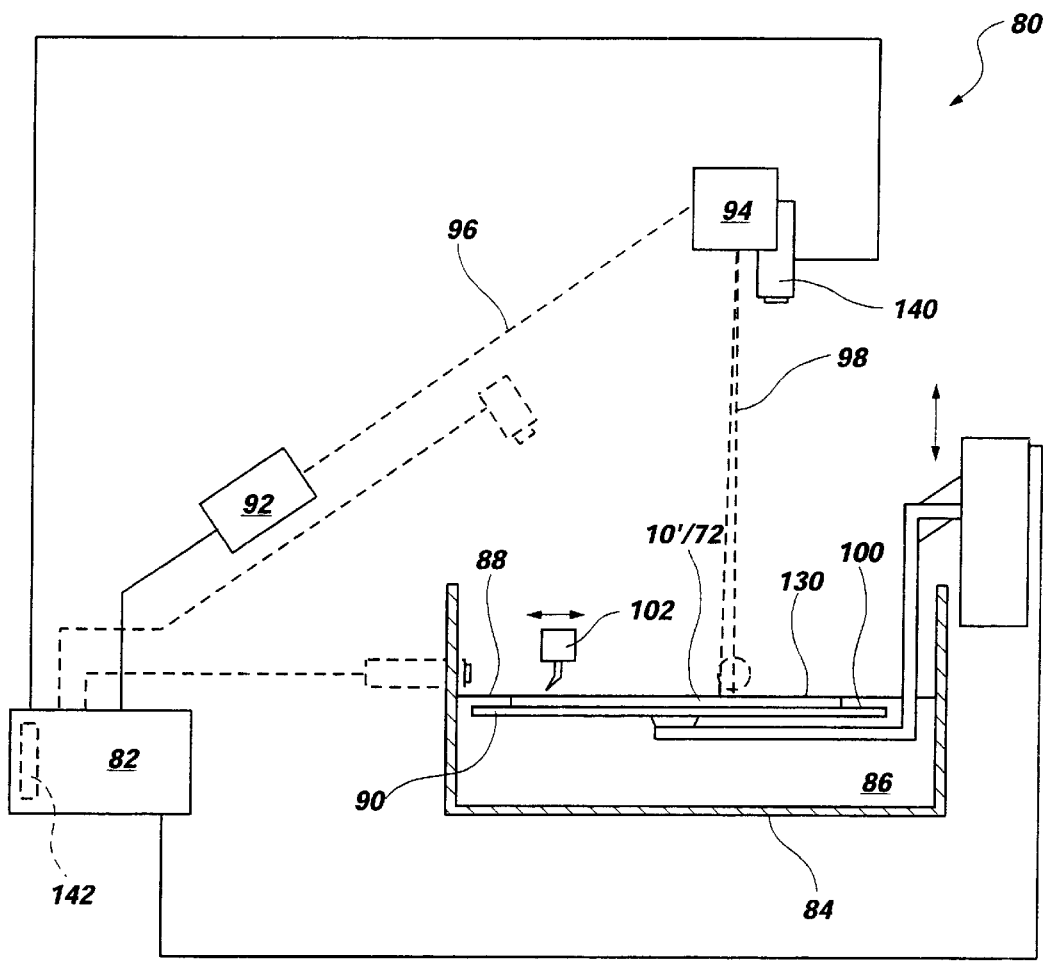
FIG. 9 is a schematic representation of an exemplary stereolithography apparatus that can be employed in the method of the present invention to mark semiconductor devices or other substrates in accordance with the method of the present invention.

FIG. 9 schematically depicts various components, and operation, of an exemplary stereolithography apparatus 80 to facilitate the reader's understanding of the technology employed in implementation of the method of the present invention, although those of ordinary skill in the art will understand and appreciate that apparatus of other designs and manufacture may be employed in practicing the method of the present invention. The preferred, basic stereolithography apparatus for implementation of the method of the present invention, as well as operation of such apparatus, are described in great detail in United States Patents assigned to 3D Systems, Inc. of Valencia, Calif., such patents including, without limitation, U.S. Pat. Nos. 4,575,330; 4,929,402; 4,996,010; 4,999,143; 5,015,424; 5,058,988; 5,059,021; 5,059,359; 5,071,337; 5,076,974; 5,096,530; 5,104,592; 5,123,734; 5,130,064; 5,133,987; 5,141,680; 5,143,663; 5,164,128; 5,174,931; 5,174,943; 5,182,055; 5,182,056; 5,182,715; 5,184,307; 5,192,469; 5,192,559; 5,209,878; 5,234,636; 5,236,637; 5,238,639; 5,248,456; 5,256,340; 5,258,146; 5,267,013; 5,273,691; 5,321,622; 5,344,298; 5,345,391; 5,358,673; 5,447,822; 5,481,470; 5,495,328; 5,501,824; 5,554,336; 5,556,590; 5,569,349; 5,569,431; 5,571,471; 5,573,722; 5,609,812; 5,609,813; 5,610,824; 5,630,981; 5,637,169; 5,651,934; 5,667,820; 5,672,312; 5,676,904; 5,688,464; 5,693,144; 5,695,707; 5,711,911; 5,776,409; 5,779,967; 5,814,265; 5,850,239; 5,854,748; 5,855,718; 5,855,836; 5,885,511; 5,897,825; 5,902,537; 5,902,538; 5,904,889; 5,943,235; and 5,945,058. The disclosure of each of the foregoing patents is hereby incorporated herein by this reference.

With continued reference to FIG. 9 and as noted above, a 3-D CAD drawing of an object (e.g., marking 36 of FIGS. 4 and 5) to be fabricated in the form of a data file is placed in the memory of a computer 82 controlling the operation of apparatus 80 if computer 82 is not a CAD computer in which the original object design is effected. In other words, an object design may be effected in a first computer in an engineering or research facility and the data files transferred via wide or local area network, tape, disc, CD-ROM, or otherwise as known in the art to computer 82 of apparatus 80 for object fabrication.

The data is preferably formatted in an STL (for STereoLithography) file, STL being a standardized format employed by a majority of manufacturers of stereolithography equipment. Fortunately, the format has been adopted for use in many solid-modeling CAD programs, so translation from another internal geometric database format is often unnecessary. In an STL file, the boundary surfaces of an object are defined as a mesh of interconnected triangles.

Apparatus 80 also includes a reservoir 84 (which may comprise a removable reservoir interchangeable with others containing different materials) of an unconsolidated material 86 to be employed in fabricating the intended object. In the currently preferred embodiment, the unconsolidated material 86 is a liquid, photo-curable polymer, or "photopolymer", that cures in response to light in the UV wavelength range. The surface level 88 of material 86 is automatically maintained at an extremely precise, constant magnitude by devices known in the art responsive to output of sensors within apparatus 80 and preferably under control of computer 82. A support platform or elevator 90, precisely vertically movable in fine, repeatable increments responsive to control of computer 82, is located for movement downward into and upward out of material 86 in reservoir 84.

Figure 10:
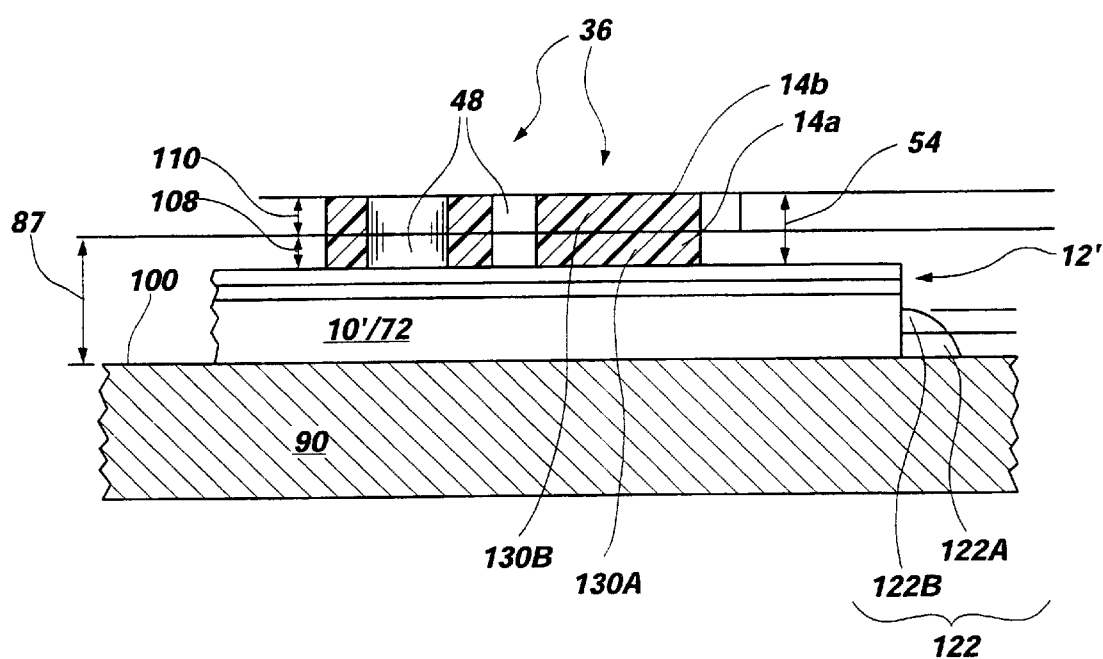
FIG. 10 is a partial cross-sectional side view of a semiconductor device or substrate disposed on a platform of a stereolithographic apparatus and depicting the semiconductor device or substrate being marked.

An object may be fabricated directly on platform 90, or on a substrate disposed on platform 90. When the object is to be fabricated on a substrate disposed on platform 90, the substrate may be positioned on platform 90 and secured thereto by way of one or more base supports 122 (FIG. 10). Such base supports 122 may be fabricated before or simultaneously with the stereolithographic fabrication of one or more objects on platform 90 or a substrate disposed thereon.

These supports 122 prevent lateral movement of the substrate or object being formed relative to a surface 100 of platform 90. Supports 122 may also provide a perfectly horizontal reference plane for fabrication of one or more objects, as well as facilitate the removal of a substrate or formed object from platform 90 following the stereolithographic fabrication of one or more objects on the substrate. Moreover, where a so-called "recoater" blade 102 is employed to form a layer of material on platform 90 or a substrate disposed thereon, supports 122 can preclude inadvertent contact of recoater blade 102, to be described in greater detail below, with surface 100 of platform 90.

Apparatus 80 has a UV wavelength range laser plus associated optics and galvanometers (collectively identified as laser 92) for controlling the scan of laser beam 96 in the X-Y plane across platform 90. Laser 92 has associated therewith a mirror 94 to reflect beam 96 downwardly as beam 98 toward surface 100 of platform 90. Beam 98 is traversed in a selected pattern in the X-Y plane, that is to say, in a plane parallel to surface 100, by initiation of the galvanometers under control of computer 82 to at least partially cure, by impingement thereon, selected portions of material 86 disposed over surface 100 to at least a partially consolidated (e.g., semisolid) state. The use of mirror 94 lengthens the path of the laser beam, effectively doubling same, and provides a more vertical beam 98 than would be possible if the laser 92 itself were mounted directly above platform surface 100, thus enhancing resolution.

Referring now to FIGS. 9 and 10, data from the STL files resident in computer 82 is manipulated to build an object, such as a marking 36, illustrated in FIGS. 4–7, or base supports 122, one layer at a time. Accordingly, the data mathematically representing one or more of the objects to be fabricated are divided into subsets, each subset representing a slice or layer of the object. The division of data is effected by mathematically sectioning the 3-D CAD model into at least one layer, a single layer or a "stack" of such layers representing the object. Each slice may be from about 0.0001 to about 0.0300 inch thick. As mentioned previously, a thinner slice promotes higher resolution by enabling better reproduction of fine vertical surface features of the object or objects to be fabricated.

When one or more base supports 122 are to be stereolithographically fabricated, supports 122 may be programmed as a separate STL file from the other objects to be fabricated. The primary STL file for the object or objects to be fabricated and the STL file for base support(s) 122 are merged.

Before fabrication of a first layer for a support 122 or an object is commenced, the operational parameters for apparatus 80 are set to adjust the size (diameter if circular) of the laser light beam used to cure material 86. In addition, computer 82 automatically checks and, if necessary, adjusts by means known in the art the surface level 88 of material 86 in reservoir 84 to maintain same at an appropriate focal length for laser beam 98. U.S. Pat. No. 5,174,931, referenced above and previously incorporated herein by reference, discloses one suitable level control system. Alternatively, the height of mirror 94 may be adjusted responsive to a detected surface level 88 to cause the focal point of laser beam 98 to be located precisely at the surface of material 86 at surface level 88 if level 88 is permitted to vary, although this approach is more complex. Platform 90 may then be submerged in material 86 in reservoir 84 to a depth equal to the thickness of one layer or slice of the object to be formed, and the material surface level 88 is readjusted as required to accommodate material 86 displaced by submergence of platform 90. Laser 92 is then activated so laser beam 98 will scan unconsolidated (e.g., liquid or powdered) material 86 disposed over surface 100 of platform 90 to at least partially consolidate (e.g., polymerize to at least a semisolid state) material 86 at selected locations, defining the boundaries of a first layer 122A of base support 122 and filling in solid portions thereof. Platform 90 is then lowered by a distance equal to the thickness of second layer 122B, and laser beam 98 scanned over selected regions of the surface of material 86 to define and fill in the second layer while simultaneously bonding the second layer to the first. The process may then be repeated, as often as necessary, layer by layer, until base support 122 is completed. Platform 90 is then moved relative to mirror 94 to form any additional base supports 122 on platform 90 or a substrate disposed thereon or to fabricate objects upon platform 90, base support 122, or a substrate, as provided in the control software. The number of layers required to erect support 122 or one or more other objects to be formed depends upon the height of the object or objects to be formed and the desired layer thickness 108, 110. The layers of a stereolithographically fabricated structure with a plurality of layers may have different thicknesses.

If a recoater blade 102 is employed, the process sequence is somewhat different. In this instance, surface 100 of platform 90 is lowered into unconsolidated (e.g., liquid) material 86 below surface level 88 a distance greater than a thickness of a single layer of material 86 to be cured, then raised above surface level 88 until platform 90, a substrate disposed thereon, or a structure being formed on either platform 90 or a substrate thereon is precisely one layer's thickness below blade 102. Blade 102 then sweeps horizontally over platform 90 or (to save time) at least over a portion thereof on which one or more objects are to be fabricated to remove excess material 86 and leave a film of precisely the desired thickness. Platform 90 is then lowered so that the surface of the film and material surface level 88 are coplanar and the surface of the unconsolidated material 86 is still. Laser 92 is then initiated to scan with laser beam 98 and define the first layer 130A. The process is repeated, layer by layer, to define each succeeding layer 130B and simultaneously bond same to the next lower layer 130 until all of the layers of the object or objects to be fabricated are completed. A more detailed discussion of this sequence and apparatus for performing same is disclosed in U.S. Pat. No. 5,174,931, previously incorporated herein by reference.

As an alternative to the above approach to preparing a layer of material 86 for scanning with laser beam 98, a layer of unconsolidated (e.g., liquid) material 86 may be formed on surface 100 of support platform 90, on a substrate disposed on platform 90, or on one or more objects being fabricated by lowering platform 90 to flood material 86 over surface 100, over a substrate disposed thereon, or over the highest completed layer of the object or objects being formed, then raising platform 90 and horizontally traversing a so-called "meniscus" blade horizontally over platform 90 to form a layer of unconsolidated material having the desired thickness over platform 90, the substrate, or each of the objects being formed. Laser 92 is then initiated and a laser beam 98 scanned over the layer of unconsolidated material to define at least the boundaries of the solid regions of the next higher layer of the object or objects being fabricated.

Yet another alternative to layer preparation of unconsolidated (e.g., liquid) material 86 is to merely lower platform 90 to a depth equal to that of a layer of material 86 to be scanned, and to then traverse a combination flood bar and meniscus bar assembly horizontally over platform 90, a substrate disposed on platform 90, or one or more objects being formed to substantially concurrently flood material 86 thereover and to define a precise layer thickness of material 86 for scanning.

All of the foregoing approaches to liquid material flooding and layer definition and apparatus for initiation thereof are known in the art and are not material to practice of the present invention, so no further details relating thereto will be provided herein.

In practicing the present invention, a commercially available stereolithography apparatus operating generally in the manner as that described above with respect to apparatus 80 of FIG. 9 is preferably employed, but with further additions and modifications as hereinafter described for practicing the method of the present invention. For example and not by way of limitation, the SLA-250/50HR, SLA-5000 and SLA-7000 stereolithography systems, each offered by 3D Systems, Inc. of Valencia, Calif., are suitable for modification. Photopolymers believed to be suitable for use in practicing the present invention include Cibatool SL 5170 and SL 5210 resins for the SLA-250/50HR system, Cibatool SL 5530 resin for the SLA-5000 and 7000 systems, and Cibatool SL 7510 resin for the SLA-7000 system. All of these photopolymers are available from Ciba Specialty Chemicals Corporation.

By way of example and not limitation, the layer thickness of material 86 to be formed, for purposes of the invention, may be on the order of about 0.0001 to 0.0300 inch, with a high degree of uniformity. It should be noted that different material layers may have different heights, so as to form a structure of a precise, intended total height or to provide different material thicknesses for different portions of the structure. The size of the laser beam "spot" impinging on the surface of material 86 to consolidate (e.g., cure) same may be on the order of 0.001 inch to 0.008 inch. Resolution is preferably ±0.0003 inch in the X-Y plane (parallel to surface 100) over at least a 0.5 inch×0.25 inch field from a center point, permitting a high resolution scan effectively across a 1.0 inch×0.5 inch area. Of course, it is desirable to have substantially this high a resolution across the entirety of surface 100 of platform 90 to be scanned by laser beam 98, such area being termed the "field of exposure", such area being substantially coextensive with the vision field of a machine vision system employed in the apparatus of the invention as explained in more detail below. The longer and more effectively vertical the path of laser beam 96/98, the greater the achievable resolution.

Referring again to FIG. 9, it should be noted that apparatus 80 useful in the method of the present invention includes a camera 140 which is in communication with computer 82 and preferably located, as shown, in close proximity to optics and scan controller, such as mirror 94 located above surface 100 of support platform 90. Camera 140 may be any one of a number of commercially available cameras, such as capacitive-coupled discharge (CCD) cameras available from a number of vendors. Suitable circuitry as required for adapting the output of camera 140 for use by computer 82 may be incorporated in a board 142 installed in computer 82, which is programmed as known in the art to respond to images generated by camera 140 and processed by board 142. Camera 140 and board 142 may together comprise a so-called "machine vision system" and, specifically, a "pattern recognition system" (PRS), the operation of which will be described briefly below for a better understanding of the present invention. Alternatively, a self-contained machine vision system available from a commercial vendor of such equipment may be employed.

For example, and without limitation, such systems are available from Cognex Corporation of Natick, Massachusetts. For example, the apparatus of the Cognex BGA Inspection Package™ or the SMD Placement Guidance Package™ may be adapted to the present invention, although it is believed that the MVS-8000™ product family and the Checkpoint® product line, the latter employed in combination with Cognex PatMax™ software, may be especially suitable for use in the present invention.

It is noted that a variety of machine vision systems are in existence, examples of which and their various structures and uses are described, without limitation, in U.S. Pat. Nos. 4,526,646; 4,543,659; 4,736,437; 4,899,921; 5,059,559; 5,113,565; 5,145,099; 5,238,174; 5,463,227; 5,288,698; 5,471,310; 5,506,684; 5,516,023; 5,516,026; and 5,644,245. The disclosure of each of the immediately foregoing patents is hereby incorporated by this reference.

Stereolithographic Fabrication of the Markings

In order to facilitate fabrication of one or more markings 36, as well as a package 12', in accordance with the method of the present invention with apparatus 80, a data file representative of the size, configuration, thickness and surface topography of, for example, a particular type and design of semiconductor device 10' or other substrate upon which one or more markings 36 and package 12' are to be fabricated is placed in the memory of computer 82. Also, as markings 36 may protrude somewhat from semiconductor device 10', a data file representative of structures (e.g., wire bonds or solder bumps) or of a substrate to which semiconductor device 10' is to be connected (e.g., in a face-down orientation) and the features (e.g., solder bumps) thereof may be placed in memory.

One or more semiconductor devices 10', wafers 72 (see FIG. 8), or other substrates may be placed on surface 100 of platform 90 to be packaged and labeled with markings 36. If one or more semiconductor devices 10', wafers 72, or other substrates are to be held on or supported above platform 90 by stereolithographically formed base supports 122, one or more layers of material 86 are sequentially disposed on surface 100 and selectively altered by use of laser 92 to form base supports 122.

Camera 140 is then activated to locate the position and orientation of each semiconductor device 10', including those on a wafer 72 (see FIG. 8), or other substrate upon which markings 36 are to be fabricated. The features of each semiconductor device 10', wafer 72, or other substrate are compared with those in the data file residing in memory, the locational and orientational data for each semiconductor device 10', wafer 72, or other substrate then also being stored in memory. It should be noted that the data file representing the design size, shape and topography for each semiconductor device 10' or other substrate may be used at this juncture to detect physically defective or damaged semiconductor devices 10' or other substrates prior to fabricating a package 12' or markings 36 thereon or before conducting further processing or assembly of semiconductor device 10' or other substrates. Accordingly, such damaged or defective semiconductor devices 10' or other substrates can be deleted from the stereolithographic labeling process, from further processing, from further testing, or from assembly with other components. It should also be noted that data files for more than one type (size, thickness, configuration, surface topography) of each semiconductor device 10' or other substrate may be placed in computer memory and computer 82 programmed to recognize not only the locations and orientations of each semiconductor device 10' or other substrate, but also the type of semiconductor device 10' or other substrate at each location upon platform 90 so that material 86 may be at least partially consolidated by laser beam 98 in the correct pattern and to the height required to define markings 36 in the appropriate, desired locations on each semiconductor device 10' or other substrate.

Continuing with reference to FIGS. 9 and 10, wafer 72 or the one or more semiconductor devices 10' or other substrates on platform 90 may then be submerged partially below the surface 88 level of unconsolidated material 86 to a depth greater than the thickness 87 of a first layer of material 86 to be at least partially consolidated (e.g., cured to at least a semisolid state) to form a first material layer 14*a* and, thus, the lowest layer 130A of each marking 36 at the appropriate location or locations on each semiconductor device 10' or other substrate, then raised to a depth equal to the layer thickness, surface 88 of material 86 being allowed to become calm. Photopolymers that are useful as material 86 exhibit a desirable dielectric constant exhibit, low shrinkage upon cure, are of sufficient (i.e., semiconductor grade) purity, exhibit good adherence to other semiconductor device materials, and have a similar coefficient of thermal expansion (CTE) to the primary materials of the substrates to which markings 36 are to be secured. Exemplary photopolymers exhibiting these properties are believed to include, but are not limited to, the above-referenced resins from Ciba Specialty Chemical Company. One area of particular concern in determining resin suitability is the substantial absence of mobile ions, and specifically fluorides.

Markings 36 are formed following or substantially simultaneously with the fabrication of package 12', such as by the process disclosed in the '142 application, the disclosure of which was previously incorporated herein by reference.

Laser 92 is then activated and scanned to direct beam 98, under control of computer 82, toward specific locations of surface 88 relative to each semiconductor device 10' or other substrate to effect the aforementioned partial cure of material 86 to form a first layer 130A of each marking 36. Platform 90 is then lowered into reservoir 84 and raised a distance equal to the desired thickness of another layer 130B of each marking 36 to provide another material layer 14*b* over wafer 72 or more semiconductor devices 10', and laser 92 is activated to form another layer 130B of to each marking 36 under construction from material layer 14*b*. This sequence continues, layer by layer, until each of the layers 130 of markings 36 have been completed.

In FIG. 10, the first layer of marking 36 is identified by numeral 130A, and the second layer is identified by numeral 130B. Likewise, the first layer of base support 122 is identified by numeral 122A and the second layer thereof is identified by numeral 122B. As illustrated, both base support 122 and marking 36 have only two layers. Markings 36 with any number of layers 130 are, however, within the scope of the present invention.

Each layer 130A, 130B of marking 36 may be built by first defining any internal and external object boundaries of that layer with laser beam 98, then hatching solid areas of marking 36 located within the object boundaries with laser beam 98. An internal boundary of a layer may comprise aperture 48, a through-hole, a void, or a recess in marking 36, for example. If a particular layer includes a boundary of a void in the object above or below that layer, then laser beam 98 is scanned in a series of closely-spaced, parallel vectors so as to develop a continuous surface, or skin, with improved strength and resolution. The time it takes to form each layer depends upon the geometry thereof, the surface tension and viscosity of material 86, and the thickness of that layer.

Alternatively, markings 36 may each be formed as a partially cured outer skin extending above the surface of a semiconductor device 10' or other substrate and forming a dam within which unconsolidated material 86 can be contained. This may be particularly useful where the markings 36 protrude a relatively high distance 54 from the surface of the substrate. In this instance, support platform 90 may be submerged so that material 86 enters the area within the dam, raised above surface level 88, and then laser beam 98 activated and scanned to at least partially cure material 86 residing within the dam or, alternatively, to merely cure a "skin" comprising the surface of markings 36, a final cure of the material of the markings 36 being effected subsequently by broad-source UV radiation in a chamber, or by thermal cure in an oven. In this manner, markings 36 of extremely precise dimensions and, thus, of extremely high clarity may be formed of material 86 by apparatus 80 in minimal time.

Once markings 36, or at least the outer skins thereof, have been fabricated, platform 90 is elevated above surface level 88 of material 86 and platform 90 is removed from apparatus 80, along with any substrate (e.g., semiconductor device 10', wafer 72 (see FIG. 8), or other substrate) disposed thereon and any stereolithographically fabricated structures, such as markings 36 and package 12'. Excess unconsolidated material 86 (e.g., excess uncured liquid) may be manually removed from platform 90, from any substrate disposed thereon, and from markings 36 and package 12'. Each semiconductor device 10', wafer 72, or other substrate is removed from platform 90, such as by cutting the substrate free of base supports 122. Alternatively, stabilizers 122 may be configured to readily release semiconductor devices 10', wafers 72, or other substrates. As another alternative, a solvent may be employed to release base supports 122 from platform 90. Such release and solvent materials are known in the art. See, for example, U.S. Pat. No. 5,447,822 referenced above and previously incorporated herein by reference.

Markings 36, package 12', and semiconductor device 10' or test substrate 32 may also be cleaned by use of known solvents that will not substantially degrade, deform, or damage markings 36, package 12', or a substrate to which package 12' or markings 36 are secured.

As noted previously, markings 36 and package 12' may then require postcuring. Markings 36 or package 12' may have regions of unconsolidated material contained within a boundary or skin thereof or in a shadowed area (see FIGS. 5 and 6), or material 86 may be only partially consolidated (e.g., polymerized or cured) and exhibit only a portion (typically 40% to 60%) of its fully consolidated strength. Postcuring to completely harden markings 36 and package 12' may be effected in another apparatus projecting UV radiation in a continuous manner over markings 36 and package 12', or by thermal completion of the initial, UV-initiated partial cure.

Although FIGS. 9 and 10 illustrate the stereolithographic fabrication of markings 36 on a substrate, such as a semiconductor device 10', a wafer 72 (FIG. 8), or another substrate, including a plurality of semiconductor devices 10' or other substrates, markings 36 can be fabricated separately from a substrate, then secured to the substrate by known processes, such as by the use of a suitable adhesive material.

The use of a stereolithographic process as exemplified above to fabricate markings 36 is particularly advantageous since a large number of markings 36 may be fabricated in a short time, the dimensions and positions thereof are computer controlled to be extremely precise, wastage of construction material 86 is minimal, and the stereolithography method requires minimal handling of semiconductor devices 10', wafers 72, or other substrates.

Stereolithography is also an advantageous method of fabricating markings 36 according to the present invention since stereolithography can be conducted at substantially ambient temperature, the small spot size and rapid traverse of laser beam 98 resulting in negligible thermal stress upon semiconductor devices 10', wafers 72, or other substrates, as well as on the features thereof.

The stereolithography fabrication process may also advantageously be conducted at the wafer level or on multiple substrates, saving fabrication time and expense. As the stereolithography method of the present invention recognizes specific semiconductor devices 10' or other substrates, variations between individual substrates are accommodated. Accordingly, when the stereolithography method of the present invention is employed, markings 36 can be simultaneously fabricated on different types of semiconductor devices 10' or other substrates, as well as on both semiconductor devices 10' and other substrates.

While the present invention has been disclosed in terms of certain preferred embodiments, those of ordinary skill in the art will recognize and appreciate that the invention is not so limited. Additions, deletions and modifications to the disclosed embodiments may be effected without departing from the scope of the invention as claimed herein. Similarly, features from one embodiment may be combined with those of another while remaining within the scope of the invention.

What is claimed is:

1. A method of labeling a semiconductor device component, comprising:
   providing at least one substrate;
   disposing at least one layer of an uncured photopolymer over a surface of said at least one substrate; and
   at least partially curing a plurality of selected areas of said at least one layer in a sequential fashion to form a corresponding layer of a mark over said surface.

2. The method of claim 1, wherein said at least partially curing comprises directing a UV laser over said plurality of selected areas of said at least one layer.

3. The method of claim 2, wherein said at least partially curing comprises curing at least edges of said corresponding layer of said mark.

4. The method of claim 3, further comprising further curing uncured photopolymer bounded by said edges.

5. The method of claim 4, wherein said further curing comprises thermally curing said uncured photopolymer.

6. The method of claim 4, wherein said further curing comprises subjecting said uncured photopolymer to UV radiation.

7. The method of claim 3, wherein said curing at least edges comprises curing at least an outer periphery of said mark.

8. The method of claim 7, wherein said curing at least edges further comprises curing an inner periphery of said mark.

9. The method of claim 1, wherein said at least partially curing comprises sequentially curing a plurality of superimposed, contiguous layers of photopolymer and securing adjacent ones of said plurality of layers to one another.

10. A method of labeling a semiconductor device component, comprising:
    providing at least one substrate; and
    sequentially disposing layers of unconsolidated material over a surface of said at least one substrate and at least partially consolidating selected areas of each of said layers prior to disposing another of said layers.

11. The method of claim 10, wherein said sequentially disposing comprises sequentially disposing layers of photopolymer over said surface.

12. The method of claim 11, wherein said at least partially consolidating comprises at least partially curing said selected areas.

13. The method of claim 12, wherein said at least partially curing comprises directing a UV laser on said selected areas.

14. The method of claim 12, wherein said at least partially curing comprises curing at least edges of a mark to be formed by at least some of said layers.

15. The method of claim 14, further comprising further curing uncured photopolymer bounded by said edges.

16. The method of claim 14, wherein said curing said selected areas comprises curing at least an outer periphery of said mark.

17. The method of claim 16, wherein said curing at least edges further comprises curing an inner periphery of said mark.

18. A method of labeling a semiconductor device component, comprising:
    placing at least one substrate in a horizontal plane;
    recognizing a location and an orientation of said at least one substrate; and
    stereolithographically fabricating at least one mark on said at least one substrate.

19. The method of claim 18, further comprising storing data including at least one physical parameter of said at least one substrate and of said at least one mark in computer memory, and using the stored data in conjunction with a machine vision system to recognize the location and the orientation of said at least one substrate.

20. The method of claim 19, further including storing in computer memory at least one parameter of another structure to be associated with said at least one substrate.

21. The method of claim 19, further comprising using the stored data, in conjunction with said machine vision system, to effect said stereolithographically fabricating said at least one mark.

22. The method of claim 18, further comprising recognizing the location of said at least one substrate on which said at least one mark is to be fabricated.

23. The method of claim 18, further including securing said at least one substrate to a carrier prior to said placing said at least one substrate in said horizontal plane.

24. A method of packaging and marking a semiconductor device component, comprising:
    providing at least one substrate; and
    disposing at least one layer of unconsolidated material over a surface of said at least one substrate and at least partially consolidating selected areas of said at least one layer to substantially simultaneously form a layer of a package and a layer of a marking in said selected areas of said at least one layer.

25. The method of claim 24, wherein said disposing comprises disposing at least one layer of uncured photopolymer over said surface.

26. The method of claim 25, wherein said at least partially consolidating comprises at least partially curing said selected areas.

27. The method of claim 26, wherein said at least partially curing comprises directing a UV laser on said selected areas.

28. The method of claim 26, wherein said at least partially curing comprises curing at least edges of said layer of said package and of said layer of said marking to be formed from said at least one layer of uncured photopolymer.

29. The method of claim 28, further comprising further curing uncured photopolymer bounded by said edges.

30. The method of claim 28, wherein said curing at least edges comprises curing at least an outer periphery of said layer of said marking.

31. The method of claim 30, wherein said curing at least edges further comprises curing an inner periphery of said layer of said marking.

\* \* \* \* \*

UNITED STATES PATENT AND TRADEMARK OFFICE
CERTIFICATE OF CORRECTION

PATENT NO. : 6,585,927 B2
DATED : July 1, 2003
INVENTOR(S) : Ford B. Grigg, James M. Ocker and Rick A. Leininger It is certified that error appears in the above-identified patent and that said Letters Patent is hereby corrected as shown below:

Column 4,
Line 17, change "CAD initiated" to -- CAD-initiated --

Column 5,
Line 47, before "raised" delete "marking"

Column 7,
Line 36, after "processes" change "is" to -- are --
Line 64, after "components" delete the comma ","
Line 65, after "operation" delete the comma ","

Column 8,
Line 60, after "platform 90" delete the comma ","

Column 11,
Line 25, change "Corporation" to -- Inc. --

Column 12,
Line 53, after "design" insert a comma -- , --

Column 13,
Line 11, change "surface 88 level" to -- surface level 88 --
Line 18, change "surface 88" to -- surface level 88 --
Line 28, change "Company" to -- Inc. --
Line 37, change "surface 88" to -- surface level 88 --
Line 43, after "or" insert -- one or --
Line 44, after "of" delete "to"

UNITED STATES PATENT AND TRADEMARK OFFICE
CERTIFICATE OF CORRECTION

PATENT NO. : 6,585,927 B2
DATED : July 1, 2003
INVENTOR(S) : Ford B. Grigg, James M. Ocker and Rick A. Leininger It is certified that error appears in the above-identified patent and that said Letters Patent is hereby corrected as shown below:

Column 14,
Line 33, change "stabilizers 122" to -- supports 122 --

Signed and Sealed this

Twelfth Day of April, 2005

JON W. DUDAS
*Director of the United States Patent and Trademark Office*